(12) United States Patent
Oz et al.

(10) Patent No.: US 7,979,772 B2
(45) Date of Patent: Jul. 12, 2011

(54) METHOD AND SYSTEM FOR PROVIDING A CONTENTION-FREE INTERLEAVER FOR CHANNEL CODING

(75) Inventors: Jasmin Oz, Plano, TX (US); Eran Pisek, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 1199 days.

(21) Appl. No.: 11/698,686

(22) Filed: Jan. 26, 2007

(65) Prior Publication Data

US 2008/0104478 A1    May 1, 2008

Related U.S. Application Data

(60) Provisional application No. 60/854,392, filed on Oct. 25, 2006, provisional application No. 60/876,772, filed on Dec. 22, 2006.

(51) Int. Cl.
*H03M 13/00* (2006.01)

(52) U.S. Cl. ........ 714/752; 714/762; 714/788; 714/759; 714/794; 714/795; 725/109; 375/341; 375/262

(58) Field of Classification Search .................. 714/752, 714/762, 788, 759, 794–795; 725/109; 375/262, 375/341

See application file for complete search history.

(56) References Cited

U.S. PATENT DOCUMENTS

| 2005/0157685 A1* | 7/2005 | Gu et al. ................ 370/335 |
| 2008/0072122 A1* | 3/2008 | Nimbalker et al. ........ 714/774 |

* cited by examiner

*Primary Examiner* — Guy J Lamarre

(57) ABSTRACT

A method for operating a contention-free interleaver for channel coding is provided that includes generating a sub-table based on a data block size, N, and an offset vector, $\bar{v}$, of length x and generating an interleave table based on the sub-table. For a particular embodiment, the interleave table is generated based on the sub-table by generating a plurality of multiplets that together form the interleave table. In addition, the sub-table may be generated based on the data block size and the offset vector by (i) rounding the data block size up to a nearest multiple of the length, x, of the offset vector to generate a modified block size, N', and (ii) generating the sub-table of a size equal to N'/x.

27 Claims, 7 Drawing Sheets

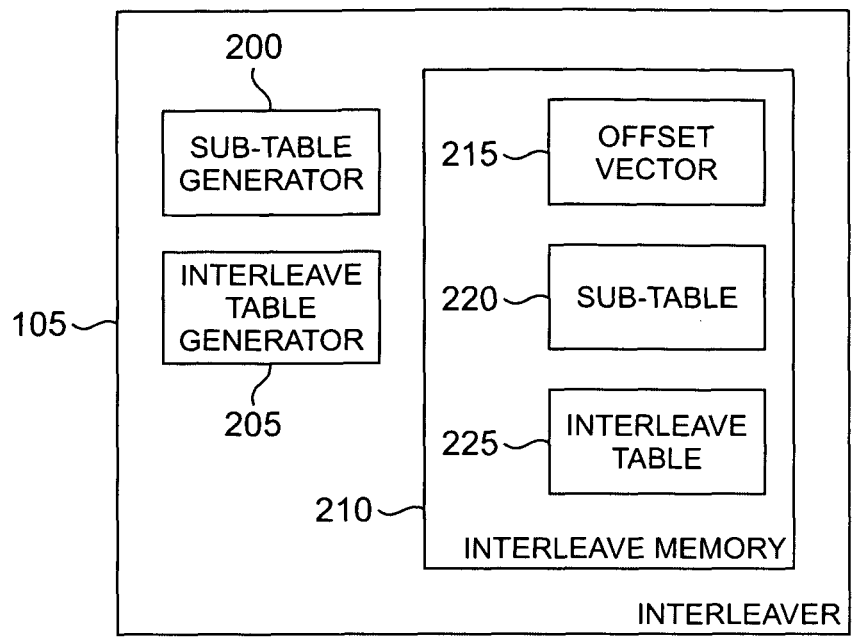
FIG. 2
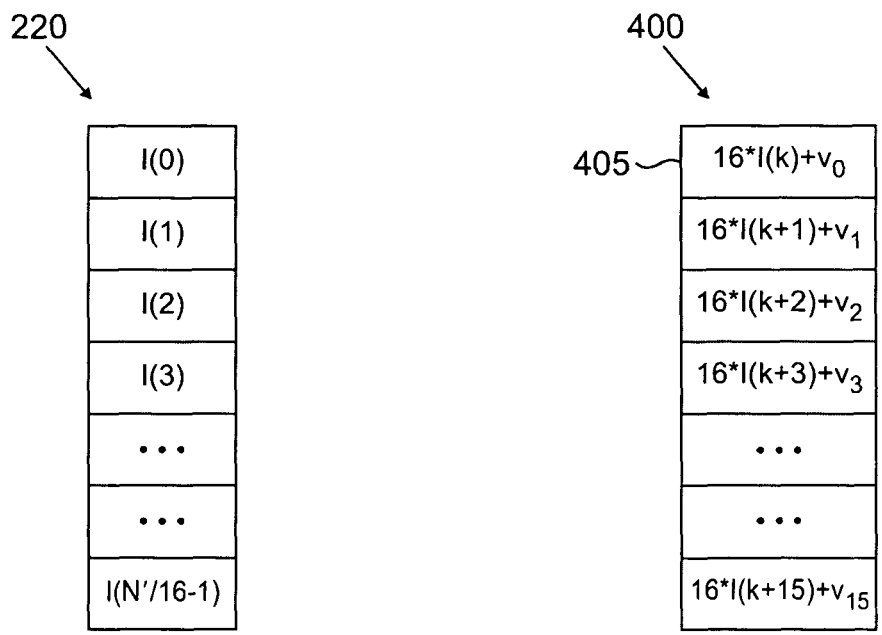
FIG. 3         FIG. 4

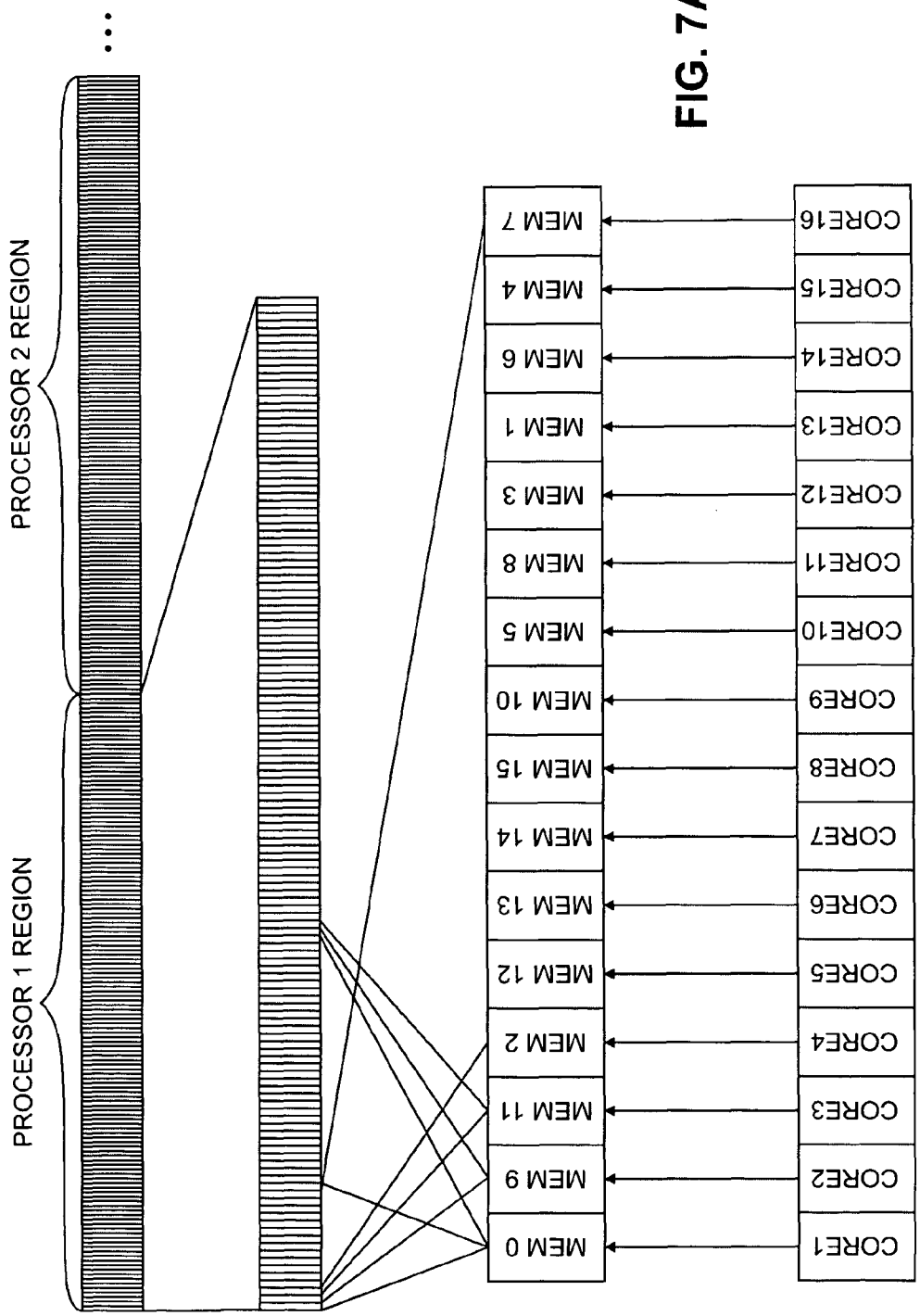

US 7,979,772 B2

METHOD AND SYSTEM FOR PROVIDING A CONTENTION-FREE INTERLEAVER FOR CHANNEL CODING

CROSS-REFERENCE TO RELATED APPLICATIONS AND CLAIM OF PRIORITY

The present application is related to U.S. Provisional Patent No. 60/854,392, filed Oct. 25, 2006, titled "Contention Free Interleaver for LTE Channel Coding" and to U.S. Provisional Patent No. 60/876,772, filed Dec. 22, 2006, titled "Contention Free Interleaver for LTE Channel Coding." U.S. Provisional Patent Nos. 60/854,392 and 60/876,772 are assigned to the assignee of the present application and are hereby incorporated by reference into the present disclosure as if fully set forth herein. The present application hereby claims priority under 35 U.S.C. §119(e) to U.S. Provisional Patent Nos. 60/854,392 and 60/876,772.

TECHNICAL FIELD OF THE INVENTION

The present application relates generally to wireless communication networks and, more specifically, to a method and system for providing a contention-free interleaver for channel coding.

BACKGROUND OF THE INVENTION

With the increased demand for higher data rate standards, such as Long Term Evolution (LTE) with more than 50 Mbps, and with hardware design processes failing to achieve the speed required to process those rates, conventional hardware designs are increasingly providing an array of processors working in parallel to increase the overall processing speed in order to achieve the required data rate. However, problems associated with this type of design include the use of conventional turbo code interleavers, such as WCDMA rel-6 turbo code interleavers, that were not designed for parallel processing and are not contention free, resulting in significant performance degradation that varies based on the data block size.

Contention-free interleavers, such as permutation interleavers, have been proposed. For example, a duobinary turbo coding interleaver in the 802.16 standard provides an interleaver that is contention-free for 2 or 4 parallel MAP decoders. However, disadvantages of currently available contention-free interleavers include the allowance of only a discrete set of block sizes and the possibility of contentions for more than 4 MAP decoders. Therefore, there is a need in the art for an improved contention-free interleaver that may be used with an array of processors operating in parallel.

SUMMARY OF THE INVENTION

A method for providing a contention-free interleaver for channel coding is provided. According to an advantageous embodiment of the present disclosure, the method includes generating a sub-table based on a data block size, N, and an offset vector, $\bar{v}$, of length x and generating an interleave table based on the sub-table.

According to another embodiment of the present disclosure, a system for providing a contention-free interleaver for channel coding is provided that includes a plurality of memories operable to store data, a plurality of decoders coupled to the memories, and an interleaver. Each decoder is operable to access a memory in each processing cycle. The interleaver is operable to generate an interleave table. The interleave table is operable to ensure that each decoder accesses a different memory with respect to the remaining decoders in each processing cycle.

According to yet another embodiment of the present disclosure, a system for providing a contention-free interleaver for channel coding is provided that includes a sub-table generator and an interleave table generator. The sub-table generator is operable to generate a sub-table based on a data block size, N, and an offset vector, $\bar{v}$, of length x. The interleave table generator is operable to generate an interleave table based on the sub-table.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or" is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 2 illustrates the interleaver of FIG. 1 according to one embodiment of the disclosure;

FIG. 3 illustrates the sub-table stored in the memory of the interleaver of FIG. 2 according to one embodiment of the disclosure;

FIG. 4 illustrates one of the multiplets that form the interleave table stored in the memory of the interleaver of FIG. 2 according to one embodiment of the disclosure;

FIGS. 7A-C illustrate processor-to-memory connections at each of three consecutive time instants for the interleave table of FIG. 6 according to one embodiment of the disclosure.

DETAILED DESCRIPTION OF THE INVENTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged coder.

Figure 1:
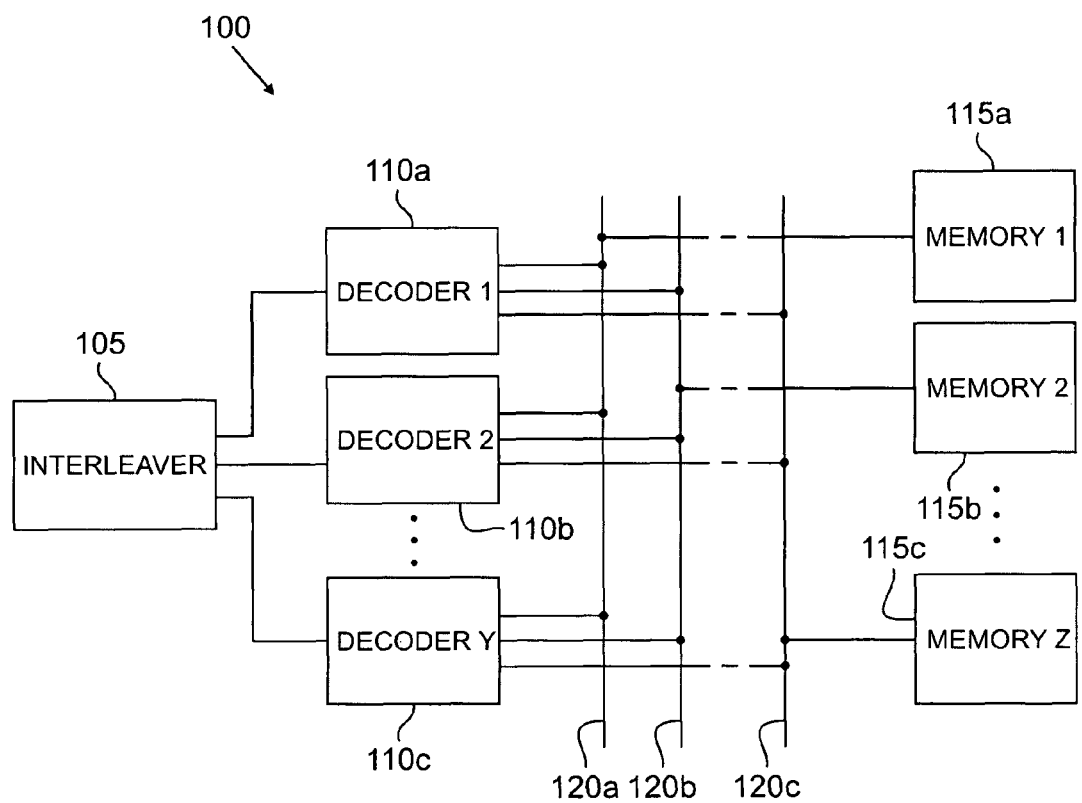
FIG. 1 illustrates a turbo coder having a contention-free interleaver for channel coding according to one embodiment of the disclosure.

FIG. 1 illustrates a turbo coder 100 comprising a contention-free interleaver 105 for channel coding according to one embodiment of the disclosure. The turbo coder 100 is operable to perform LTE channel coding or any other suitable type of channel coding. The turbo coder 100 comprises a contention-free interleaver 105, a plurality of decoders 110, a plurality of memories 115 and a bus system 120 for providing communication between the decoders 110 and the memories 115.

As described in more detail below in connection with FIG. 2, the interleaver 105 is operable to provide contention-free interleaving for parallel processors (not shown in FIG. 1) that are operable to communicate with the memories 115. The decoders 110 may each comprise a maximum a posteriori probability (MAP) decoder or other suitable type of decoder for use in channel coding. Each decoder 110 is operable to access one of the memories 115 in each processing cycle. Based on an interleave table generated by the interleaver 105, no decoder 110 attempts to access the same memory 115 as another decoder 110 during the same cycle.

The number of decoders 110 may comprise any suitable number based on the number of bits/cycle to be accessed. The number of memories 115 corresponds to the maximum number of bits/cycle that may be accessed. Thus, for one embodiment, the number of decoders 110, Y, may be equal to the number of memories 115, Z. However, it will be understood that other embodiments may be implemented.

In general, two parameters provide indicators of the interleaver performance: the interleaver minimal spread, $S_{min}$, and the dispersion parameter, $\gamma$. The performance of a turbo coder at low signal-to-noise ratio (SNR) is dominated by $S_{min}$. Maximizing the minimal spread of an interleaver results in the code converging more quickly, a lower error floor, and a steeper error slope. For one embodiment, the spread $S_{ij}$ may be defined as follows:

$$S_{ij}=|I(i)-I(j)|+|i-j| \forall i,j<N,$$

where I(i) is the interleaved version of index i and N is the block size. The minimal spread is defined as $S_{min} \equiv \min(S_{ij})$.

The dispersion parameter, $\gamma$, is an indicator for the amount of randomness of the interleaved indices and is based on the number of displacement vectors. For example, using the following equation:

$$D(I) \equiv \{(\Delta_X, \Delta_Y) \in Z^2 | \Delta_X = j-i, \Delta_Y = I(j) - I(i), 0 \leq i < j < N\},$$

the dispersion parameter may be defined as follows:

$$\gamma \equiv \frac{2|D(I)|}{N(N-1)},$$

where |D(I)| is the size of the set of displacement vectors. Using this definition, $\gamma$ ranges from 2/N to 1 and the higher its value, the more random the interleaver.

FIG. 2 illustrates the interleaver 105 of the turbo coder 100 according to one embodiment of the disclosure. The interleaver 105 comprises a sub-table generator 200, an interleave table generator 205, and an interleave memory 210. The interleave memory 210 is operable to store an offset vector 215, a sub-table 220, and an interleave table 225. It will be understood that the interleaver 105 may comprise additional components not illustrated in FIG. 2 and the interleave memory 210 may be operable to store additional information without departing from the scope of this disclosure.

As described in more detail below, the sub-table generator 200 is operable to generate the sub-table 220. In addition, the interleave table generator 205 is operable to generate the interleave table 225 by generating a plurality of multiplets that together form the interleave table 225. The sub-table 220 may comprise an $S_{min}$ that is as large as possible. For one embodiment, the sub-table 220 may comprise a standard WCDMA-compliant table. FIG. 3 illustrates the sub-table 220 according to one embodiment of the disclosure, and FIG. 4 illustrates one of the multiplets 400 that form the interleave table 225 according to one embodiment of the disclosure.

For a data block size of N, the block size may be rounded up to the nearest multiple of x, the size of the offset vector, to generate a modified block size of N'. The sub-table 220 comprises a size that is a specified fraction, 1/(size of $\bar{v}$), of the modified block size, N'. The size of the offset vector may be selected based on the number of bits/cycle to be accessed and/or the number of available memories 115. For example, for one particular embodiment, the number of memories 115 may be 16, the number of bits/cycle to be accessed may be up to 16, and thus the size of the offset vector may be 16. For this example, the sub-table 220 would comprise a size of 1/16 of the modified block size, which corresponds to N rounded up to the nearest multiple of 16. Therefore, for a block size of 1000, the modified block size would be 1008, and the sub-table 220 in this particular embodiment would have a size of (1/16)*1008=63. For a sub-table size of less than 40, the sub-table 220 may be generated according to the WCDMA interleaver algorithm.

The offset vector 215 may be predefined or otherwise suitably selected. As described in more detail below, the offset vector 215, $\bar{v}$, is operable to ensure the contention-free behavior of the interleaver 105. The offset vector 215 comprises x elements ranging from 0 to x−1 where x=size of $\bar{v}$. Thus, for the embodiment in which length of the offset vector, $\bar{v}$, is 16, the offset vector 215 comprises 16 elements ranging from 0 to 15. The difference between the first and last elements of the offset vector 215 may be approximately equal to x/2. Thus, for an offset vector of length 16, for example, the difference for some embodiments may be 7, 8 or 9.

For a particular embodiment, the elements in the offset vector 215 may be arranged in such a fashion that the interleaver 105 is contention-free for 16, 8, 4, 2 or 1 decoders 110. For example, for the embodiment in which the length of the offset vector is 16, the offset vector 215 may be arranged as follows:

$$\bar{v}=(0,9,11,2,12,13,14,15,10,5,8,3,1,6,4,7)$$

However, it will be understood that, even for an offset vector of length 16, other arrangements of the offset vector 215 may be implemented. Using the above arrangement for the offset vector 215, taking the modulus of the division of $\bar{v}$ by 4 illustrates the contention-free properties of the interleaver 105 for 4 decoders 110, as shown below:

$$\mod(\bar{v},4)=(0,1,3,2,0,1,2,3,2,1,0,3,1,2,0,3)$$

As is seen from the above equation, each consecutive set of four elements of the offset vector 215 comprises the numbers (0,1,2,3) in some arbitrary order.

The interleave table generator 205 is operable to generate the interleave table 225 as a consecutive series of N'/x multiplets 400 of x elements each. Thus, continuing with the example of an offset vector of length 16, the interleave table 225 would be a series of N'/16 multiplets 400 of 16 elements each.

The first element in a multiplet 400 is defined as the multiplet base element 405. For one embodiment, the interleave table generator 205 may be operable to generate the base element 405 by taking the $k^{th}$ element from the sub-table 220 (I(k)), multiplying it by x, and adding to it the first element in the offset vector 215 ($v_0$). The second element of the multiplet 400 may be generated by taking the $(k+1)^{th}$ element in the sub-table 220 (I(k+1)), multiplying it by x, and adding to it the second element in the offset vector 215 ($v_1$). Each following element of the multiplet 400 may be generated in a similar fashion, as illustrated in FIG. 4.

The index k of the base elements 405 for the multiplets 400 ranges from 0 to (N'/16)−1 in any suitable order. The vector of these indices, called the index vector, may be defined as $\vec{v}$. To increase the randomness parameter γ of the interleaver 105, the randomness of the index vector $\vec{k}$ may be increased. Because $\vec{k}$ comprises each of the numbers from 0 to N'/16−1, the interleave table 225 that is generated based on the multiplets 400 comprises each of the numbers from 0 to N−1 in some order.

In addition, using the above-described method, consecutive elements in each multiplet 400 are generated from consecutive elements taken from the sub-table 220, which is a WCDMA-compliant table. Therefore, the minimum spread $S_{min}$ between consecutive elements in each multiplet 400 is relatively large. Across the multiplet boundaries, $S_{min}$ is determined by the difference between the first and the last elements of the offset vector 215. For example, using the offset vector 215 described above, (0,9,11,2,12,13,14,15,10,5,8,3,1,6,4,7), the difference between the first and last elements sets $S_{min}$ to 7 in the worst case.

The above-described example of the interleaver 105 using the above example of the offset vector 215 of length 16 is contention-free for 16, 8, 4, 2 or 1 decoders 110. However, it will be understood that the interleaver 105 may be designed to be contention-free for any suitable number of decoders 110 by altering the offset vector, $\vec{v}$.

Thus, to generalize the possible numbers of decoders 110, the length of the offset vector, x, comprises the lowest common multiple of the possible numbers of decoders 110. For example, for an interleaver 105 that is contention-free for 30, 15, 10, 6, 5, 3, 2 or 1 decoders 110, the size of the offset vector would be the lowest common multiple of 30, 15, 10, 6, 5, 3, 2 and 1, or 30. In addition, as described above, another suitable offset vector 215 would be used to ensure the contention-free behavior of the interleaver 105, including a difference between the first and last elements of approximately x/2.

The index vector, $\vec{k}$, may be constructed using any suitable method. For example, for one embodiment, a random number generator may be used to generate the index vector. For another embodiment, the index vector may be constructed using double indirection. For this embodiment, the elements of the sub-table 220 may be used as pointers to values. For example, if the first element of the sub-table 220 is 17, the value at location 17 of the sub-table 220 may be used as the first element of the index vector, and so on. For yet another embodiment that is hardware-friendly, grouping may be used. For this embodiment, the first x elements of the index vector from 0 to x−1 are selected in some random order (e.g., at indices given by $\vec{v}$), the next x elements of the index vector from x to 2x−1 are selected in some random order (again, e.g., at indices given by $\vec{v}$), and so on. For any of these embodiments, the randomness parameter γ is around 0.65.

When the block size N is not a multiple of x, the table indices may be pruned. For example, for one embodiment, the table indicies may be pruned as follows:
 1. Indices which are larger than N+<number of decoders>−1 are discarded from the interleave table 105.
 2. Indices between N and N+<number of decoders>−1 are replaced by an invalid index (e.g., by a −1). (Invalid indices are ignored by the decoders 110.)

Figure 5:
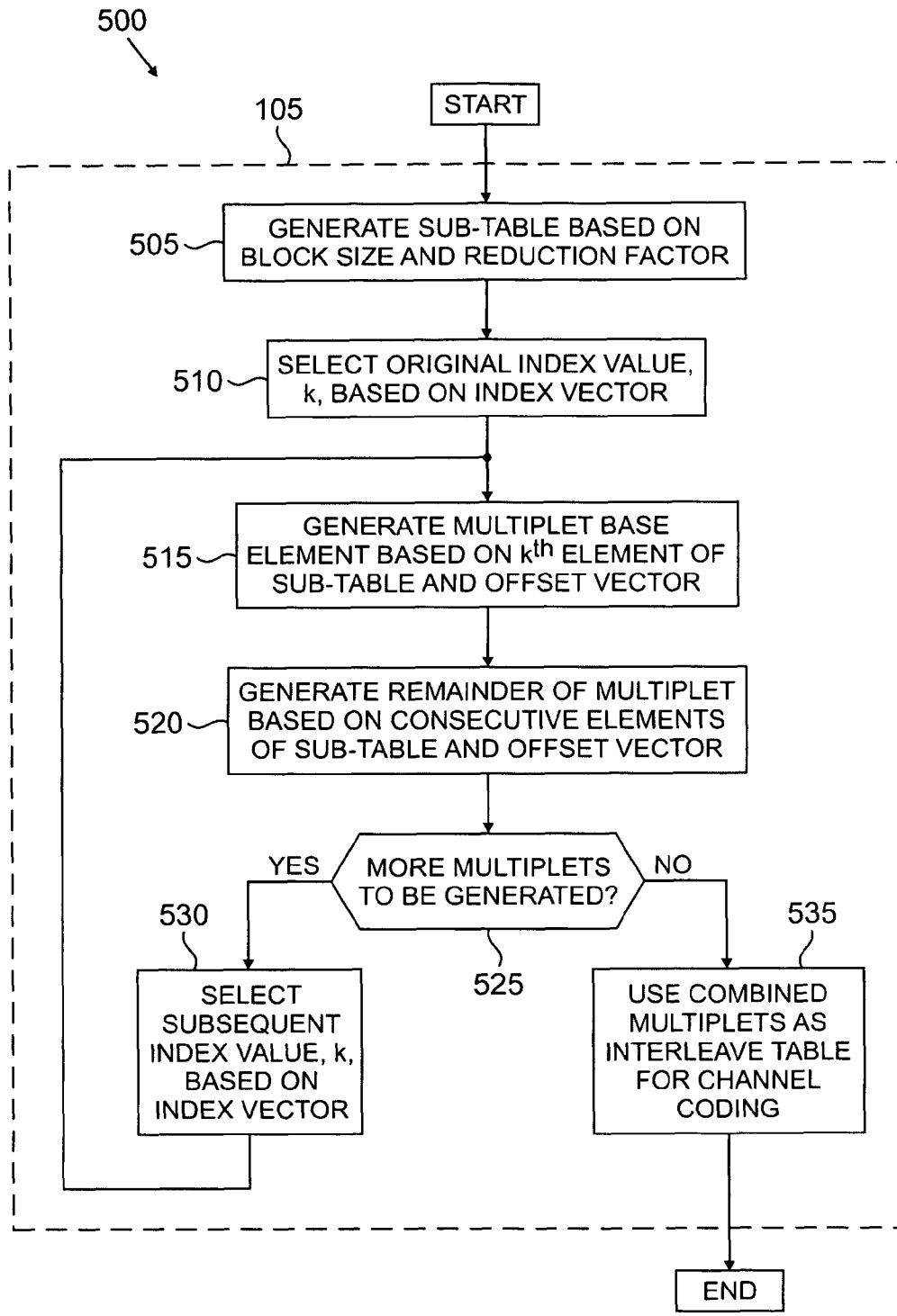
FIG. 5 is a flow diagram illustrating a method for providing the interleaver of FIG. 2 according to one embodiment of the disclosure.

FIG. 5 is a flow diagram illustrating a method 500 for providing the interleaver 105 according to one embodiment of the disclosure. Initially, the sub-table generator 200 generates the sub-table 220 based on the block size, N, and the length, x, of the offset vector, $\vec{v}$, which is based on the number of decoders 110 (process step 505). For one embodiment, the sub-table 220 comprises a size of N'/x, where N' is the modified block size as described above. For example, for a block size of N=1000 and x=16, the modified block size, N', would be 1008 and the size of the sub-table 220 would be 1008/16, or 63. The sub-table 220 comprises the elements of 0 to (N'/x)−1 in any suitable order.

The interleave table generator 205 then begins generating the interleave table 225 by beginning to generate a plurality of multiplets 400. First, the interleave table generator 205 selects an original index value, k, based on the index vector $\vec{k}$ (process step 510). For example, the original index value, k, may be the first element in the index vector, which may be constructed using a random number generator, double indirection, grouping or other suitable method. The interleave table generator 205 generates the multiplet base element 405 for the first multiplet 400 based on the $k^{th}$ element of the sub-table 220 and the offset vector 215 (process step 515). For example, the multiplet base element 405 may comprise the value $x*I(k)+v_0$, where I(k) comprises the $k^{th}$ value of the sub-table 220 and $v_i$ comprises the $(i+1)^{th}$ element of the offset vector 215. Thus, using an offset vector of length 16, the multiplet base element 405 would comprise the value $16*I(k)+v_0$.

The interleave table generator 205 generates the remainder of the multiplet 400 based on consecutive elements of the sub-table 220 following the $k^{th}$ element and based on the offset vector 215 (process step 520). For example, the second element of the multiplet 400 may be generated by multiplying the $(k+1)^{th}$ element of the sub-table 220 by x and adding the second element of the offset vector 215 to the result. The third element of the multiplet 400 may be generated by multiplying the $(k+2)^{th}$ element of the sub-table 220 by x and adding the third element of the offset vector 215 to the result, and so on.

After generating a multiplet 400, the interleave table generator 205 determines whether or not there are more multiplets 400 to be generated in order to complete the interleave table 225 (process step 525). If there are more multiplets 400 to be generated (process step 525), the interleave table generator 205 selects a subsequent index value, k, based on the index vector $\vec{k}$ (process step 530). The interleave table generator 205 then begins to generate a subsequent multiplet 400 based on the subsequently selected k value (process step 515) and the method continues as before. Once there are no more multiplets 400 to be generated (process step 525), the interleaver 105 may use the combined multiplets 400 as the interleave table 225 for channel coding, and the method comes to an end.

In this way, the interleaver 105 is contention-free for any suitable number of decoders 110 and may be expanded as desired for higher numbers of decoders 110. In addition, the interleaver 105 is based on the WCDMA turbo interleaver and thus allows re-use of its hardware. Also, the allowed block sizes are continuous, as in the case of WCDMA. Finally, the two main interleaver parameters, randomness and minimum distance, remain the same as in the WCDMA case to allow similar or even better BER/FER performance per Eb/No SNR.

Figure 6:
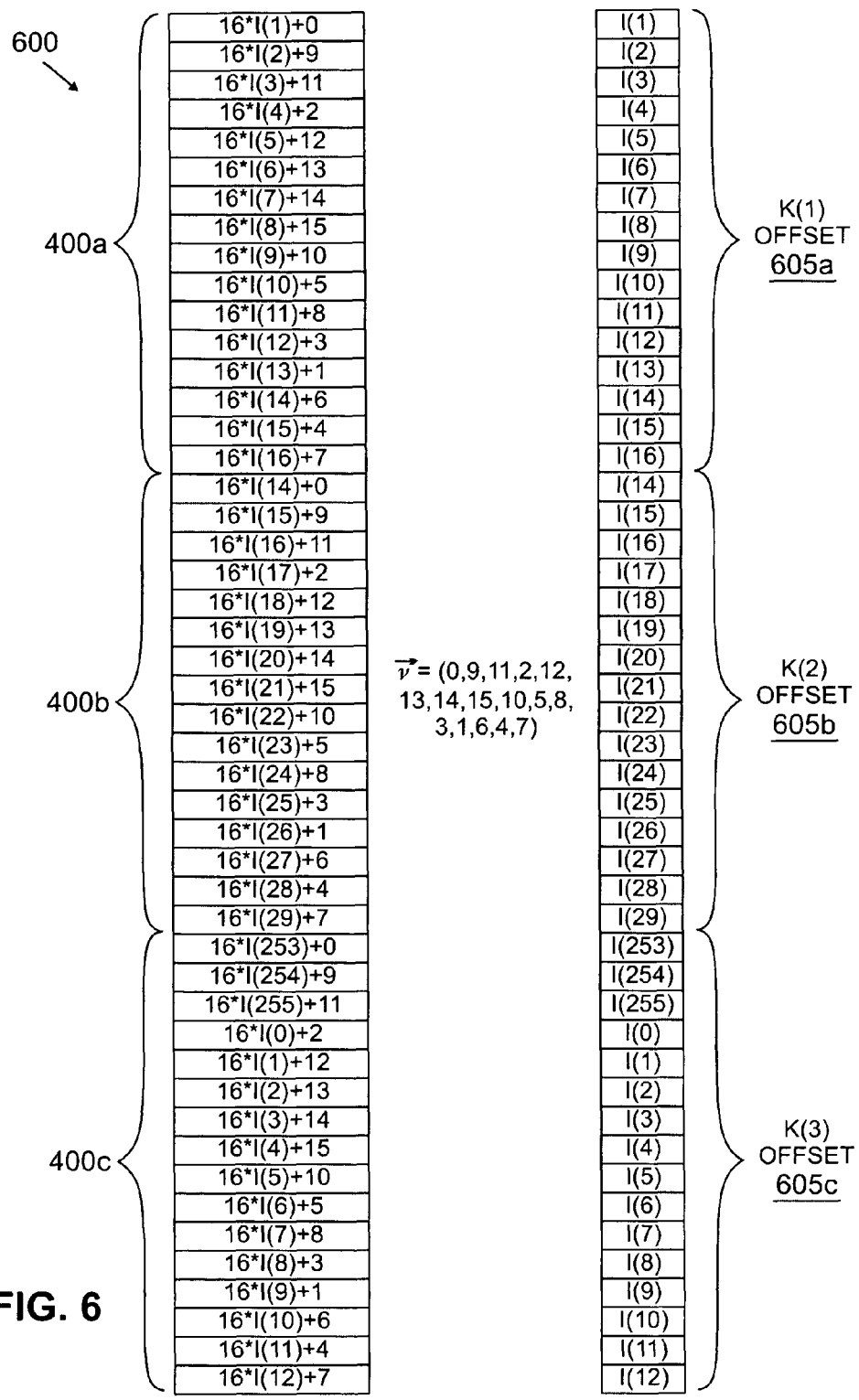
FIG. 6 illustrates an example of the construction of a portion of the interleave table of FIG. 2 according to one embodiment of the disclosure.

FIG. 6 illustrates an example of the construction of a portion of an interleave table 600, such as the interleave table 225, according to one particular embodiment of the disclosure. For this example, each multiplet 400 is generated based on a k-offset 605. The k(i) offset 605 corresponds to the $i^{th}$ k value determined based on the index vector $\vec{k}$. Thus, for the illustrated embodiment, the block size is 4096, the length of the offset vector is 16, and the index vector begins with the values 1, 14 and 253. The k(1) offset 605a then provides the elements of the sub-table 220 from 1 to 16, the k(2) offset 605b provides the elements of the sub-table 220 from 14 to 29, and the k(3) offset 605c provides the elements of the sub-table 220 from 253 to 12 (wrapping around to 0 after 255 is reached).

For the illustrated embodiment, the offset vector 215 is the same as the example described above in connection with FIG. 2. Thus, the offset vector 215 comprises the elements from 0 to 15 in the following order: 0, 9, 11, 2, 12, 13, 14, 15, 10, 5, 8, 3, 1, 6, 4, 7. Using the k-offsets 605 and this example of the offset vector 215, the first three multiplets 400 are as illustrated in FIG. 6. Each element of the multiplets 400 is generated by multiplying the sub-table elements identified by the k-offsets 605 by the length of the offset vector (i.e., 16) and then adding the corresponding offset vector element to the result. The complete interleave table 600 for this example would continue for another 253 multiplets.

Figure 7B:
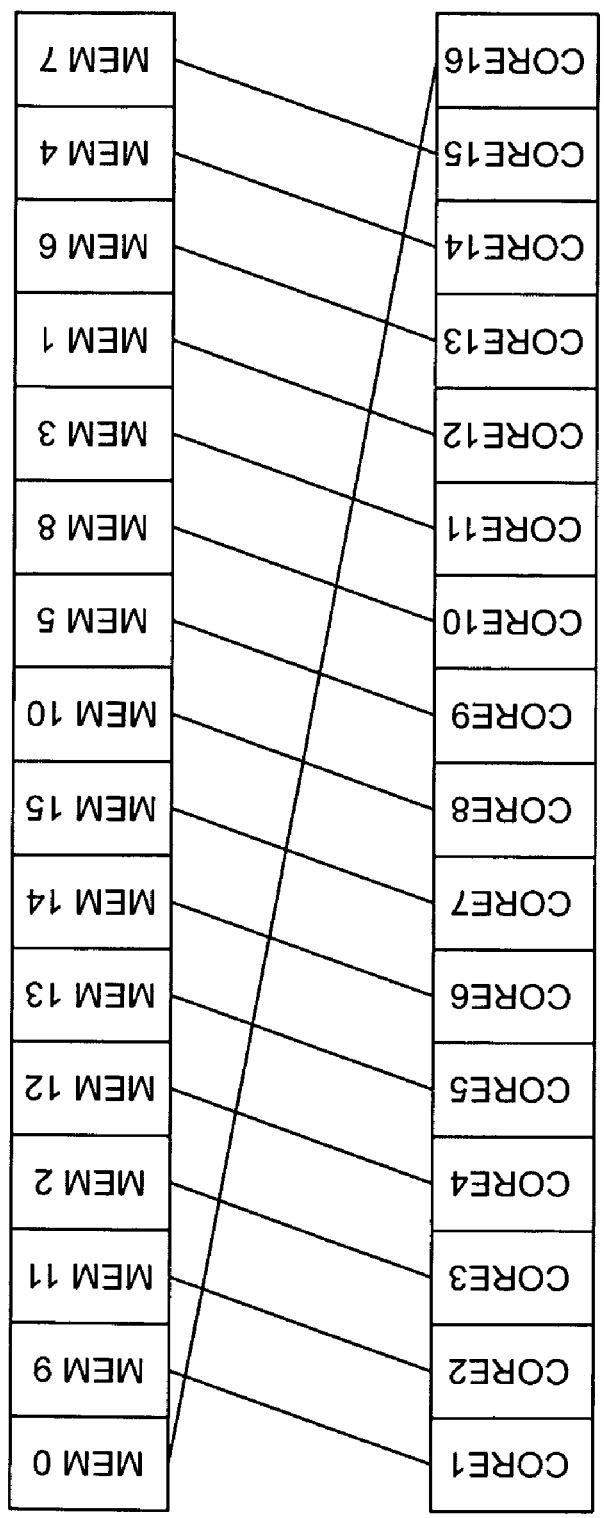
Figure 7C:
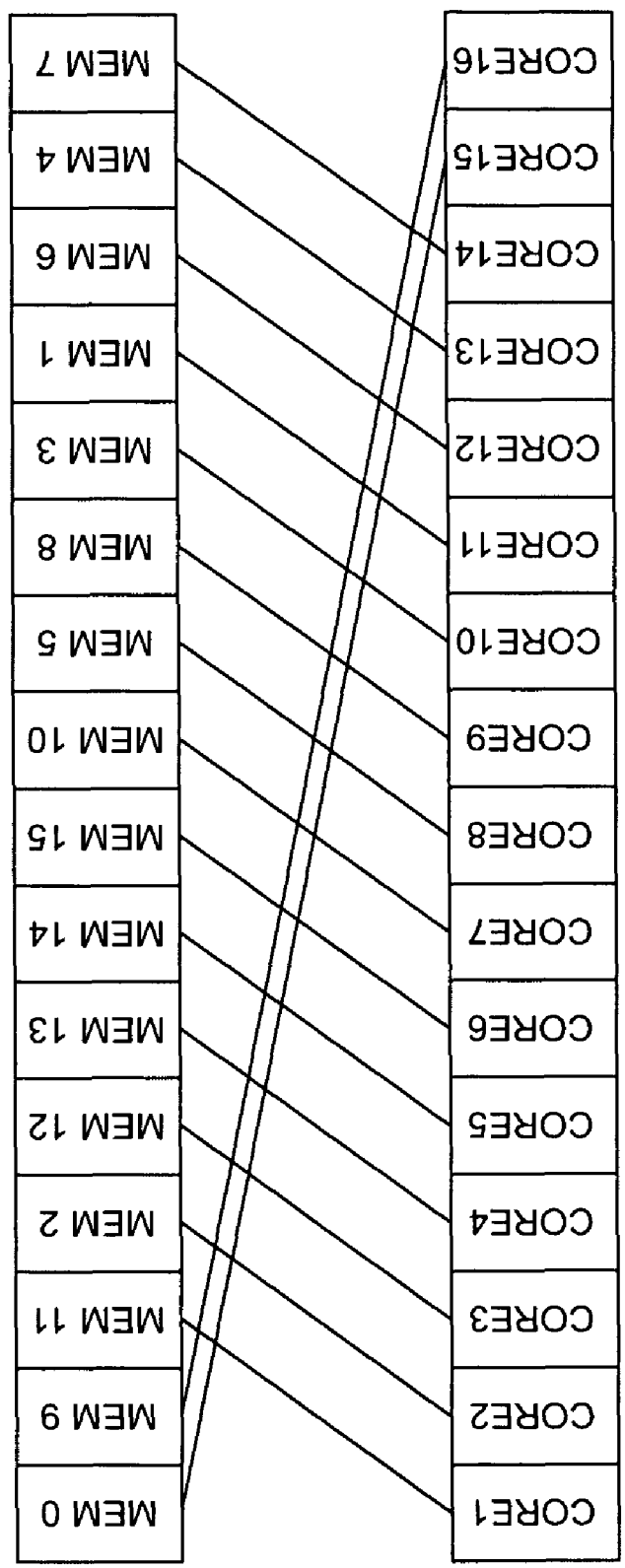

FIGS. 7A-C illustrate processor-to-memory connections at each of three consecutive time instants for the example of the interleave table 600 of FIG. 6 according to one particular embodiment of the disclosure. For this example, each of 16 processors may process 256 consecutive bits. The illustration shows details for the region of Processor 1. In this example, FIG. 7A shows the processor-to-memory connection at t=0 with the processors working in pipeline fashion and in synchronization with each other. The memories are arranged according to the previously described example of the offset vector 215. Each of the memories is operable to access a different one of the 16 cores. FIG. 7B shows the processor-to-memory connection at t=1, and FIG. 7C shows the processor-to-memory connection at t=2.

At t=0, the first memory (Mem0) is operable to access the first core (Core1), the second memory (Mem9) is operable to access the second core (Core2), the third memory (Mem11) is operable to access the third core (Core3), and so on. At t=1, the first memory (Mem0) is operable to access the last core (Core16), the second memory (Mem9) is operable to access the first core (Core1), the third memory (Mem11) is operable to access the second core (Core2), and so on. At t=2, the first memory (Mem0) is operable to access the second-to-last core (Core15), the second memory (Mem9) is operable to access the last core (Core16), the third memory (Mem11) is operable to access the first core (Core1), and so on.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for providing a contention-free interleaver for channel coding, comprising:
    generating a sub-table based on a data block size, N, and an offset vector, $\vec{v}$, of length x, a size of the sub-table based on the data block size N and the length x; and
    generating an interleave table based on the sub-table.
2. The method as set forth in claim 1, generating the interleave table based on the sub-table comprising generating a plurality of multiplets based on the sub-table, the interleave table comprising the multiplets.
3. The method as set forth in claim 2, generating the sub-table based on the data block size and the offset vector comprising:
    rounding the data block size up to a nearest multiple of the length, x, of the offset vector to generate a modified block size, N', and
    generating the sub-table of a size equal to N'/x.
4. The method as set forth in claim 3, generating the plurality of multiplets comprising generating N'/x multiplets, each multiplet comprising x elements.
5. The method as set forth in claim 4, generating the plurality of multiplets comprising, for each multiplet:
    selecting an index value, k,
    generating a base element based on the $k^{th}$ element of the sub-table and an offset vector, and
    generating a remainder of the multiplet based on consecutive elements of the sub-table following the $k^{th}$ element and based on the offset vector.
6. The method as set forth in claim 5, selecting the index value comprising selecting the index value based on an index vector, the index vector comprising each of the numbers from 0 to N'/16−1.
7. The method as set forth in claim 6, further comprising constructing the index vector using one of a random number generator, double indirection and grouping.
8. The method as set forth in claim 5, the offset vector comprising x elements ranging from 0 to x−1 in a particular order that is configured to ensure the interleaver is contention-free.
9. The method as set forth in claim 8, the difference between the first and last elements of the offset vector comprising approximately x/2.
10. A system for providing a contention-free interleaver for channel coding, comprising:
    a plurality of memories configured to store data;
    a plurality of decoders coupled to the memories, each decoder configured to access a memory in each processing cycle; and
    an interleaver configured to generate an interleave table based on a sub-table, a size of the sub-table based on a data block size, N, and a length x of an offset vector $\vec{v}$, and the interleave table configured to ensure that each decoder is configured to access a different memory with respect to the remaining decoders in each processing cycle.
11. The system as set forth in claim 10, each of the decoders comprising a maximum a posteriori probability decoder.
12. The system as set forth in claim 10, the number of decoders based on a number of bits/cycle that may be accessed.
13. The system as set forth in claim 10, the number of memories based on a maximum number of bits/cycle that may be accessed.
14. The system as set forth in claim 10, the number of decoders equal to or less than the number of memories.

15. The system as set forth in claim 10, the interleaver further configured to generate the sub-table based on the data block size, N, and the offset vector, $\bar{v}$, of length x.

16. The system as set forth in claim 15, the interleaver configured to generate the interleave table based on the sub-table by generating a plurality of multiplets based on the sub-table, the interleave table comprising the multiplets.

17. The system as set forth in claim 16, the interleaver configured to generate the sub-table based on the data block size and the offset vector by (i) rounding the data block size up to a nearest multiple of the length, x, of the offset vector to generate a modified block size, N', and (ii) generating the sub-table of a size equal to N'/x.

18. The system as set forth in claim 17, the interleaver configured to generate the plurality of multiplets by, for each multiplet, (i) selecting an index value, k, (ii) generating a base element based on the $k^{th}$ element of the sub-table and an offset vector, and (iii) generating a remainder of the multiplet based on consecutive elements of the sub-table following the $k^{th}$ element and based on the offset vector.

19. The system as set forth in claim 18, the offset vector comprising x elements ranging from 0 to x−1 in a particular order that is configured to ensure the interleaver is contention-free, and the difference between the first and last elements of the offset vector comprising approximately x/2.

20. A system for providing a contention-free interleaver for channel coding, comprising:
   a sub-table generator configured to generate a sub-table based on a data block size, N, and an offset vector, $\bar{v}$, of length x, a size of the sub-table based on the data block size N and the length x; and
   an interleave table generator configured to generate an interleave table based on the sub-table.

21. The system as set forth in claim 20, the interleave table generator configured to generate the interleave table based on the sub-table by generating a plurality of multiplets based on the sub-table, the interleave table comprising the multiplets.

22. The system as set forth in claim 21, the sub-table generator configured to generate the sub-table based on the data block size and the offset vector by (i) rounding the data block size up to a nearest multiple of the length, x, of the offset vector to generate a modified block size, N', and (ii) generating the sub-table of a size equal to N'/x.

23. The system as set forth in claim 22, the interleave table generator configured to generate the plurality of multiplets by generating N'/x multiplets, each multiplet comprising x elements.

24. The system as set forth in claim 22, the interleave table generator configured to generate the plurality of multiplets by, for each multiplet, (i) selecting an index value, k, (ii) generating a base element based on the $k^{th}$ element of the sub-table and an offset vector, and (iii) generating a remainder of the multiplet based on consecutive elements of the sub-table following the $k^{th}$ element and based on the offset vector.

25. The system as set forth in claim 24, the interleave table generator configured to select the index value by selecting the index value based on an index vector, the index vector comprising each of the numbers from 0 to N'/16−1.

26. The system as set forth in claim 25, the index vector constructed using one of a random number generator, double indirection and grouping.

27. The system as set forth in claim 24, the offset vector comprising x elements ranging from 0 to x−1 in a particular order that is configured to ensure the interleaves is contention-free, and the difference between the first and last elements of the offset vector comprising approximately x/2.

* * * * *